(12) United States Patent
Mai et al.

(10) Patent No.: US 6,531,865 B1
(45) Date of Patent: Mar. 11, 2003

(54) METHOD OF AND APPARATUS FOR TESTING AN INTEGRATED CIRCUIT PACKAGE

(75) Inventors: Zhihong Mai, Singapore (SG); Seok Hiong Tan, Singapore (SG); Seck June Foo, Johor Bahru (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/741,626

(22) Filed: Dec. 19, 2000

(51) Int. Cl.[7] .............................................. G01R 31/28
(52) U.S. Cl. .................... 324/158.1; 324/765; 324/537; 324/73.1
(58) Field of Search .............................. 324/765, 158.1, 324/763, 754, 762, 73.1, 537, 538; 714/729, 724

(56) References Cited

U.S. PATENT DOCUMENTS

| | | | | |
|---|---|---|---|---|
| 4,658,400 A | * | 4/1987 | Brown et al. ............. | 324/158.1 |
| 4,975,641 A | * | 12/1990 | Tanaka et al. ............. | 324/158.1 |
| 5,363,037 A | * | 11/1994 | Henley et al. ............. | 324/158.1 |
| 5,565,766 A | * | 10/1996 | Kuwahara et al. ........ | 324/158.1 |
| 5,748,008 A | * | 5/1998 | Landreth ................... | 324/763 |
| 5,998,282 A | | 12/1999 | Lukaszek | |

* cited by examiner

Primary Examiner—Kamand Cuneo
Assistant Examiner—Jimmy Nguyen
(74) Attorney, Agent, or Firm—Foley & Lardner

(57) ABSTRACT

A test circuit for and method of testing integrated circuit packages can be utilized to determine the existence of one or more short circuits between adjacent connectors. The system includes an interface configured to electrically connect the conductors of the integrated circuit package. The interface groups the conductors into a plurality of nodes. The number of nodes is no more than one-half the number of conductors. A control circuit is coupled to the interface. The control circuit determines the existence of one or more short circuits between adjacent conductors in response to signals on the nodes.

20 Claims, 3 Drawing Sheets

METHOD OF AND APPARATUS FOR TESTING AN INTEGRATED CIRCUIT PACKAGE

FIELD OF THE INVENTION

The present invention relates generally to packages for integrated circuits (ICs). More specifically, the present invention relates to systems for and methods of testing grid array (GA) integrated circuit packages including column grid array packages (CGA).

BACKGROUND OF THE INVENTION

Integrated circuits or ICs can be housed in an integrated circuit package. Generally, the integrated circuit or chip is mechanically and electrically attached to a substrate, such as, a ceramic or plastic substrate, and covered by a cap or plastic to protect the chip from environmental conditions. The package is attached to a printed wire board (PWB) or printed circuit board for use in an electrical device. The printed circuit board can be part of a card, a mother board, or another component of an electrical device.

Pins, columns or solder spheres are typically utilized between the substrate and the printed circuit board to provide a mechanical and electrical connection between the integrated circuit package and the printed circuit board. The top surface of the package substrate includes numerous metal contact pads which are electrically coupled through the substrate to the pins or solder spheres on the bottom surface of the package substrate. The packages associated with integrated circuits exist in a variety of forms including plastic ball grid array (PBGA) packages, ceramic ball grid array (CBGA) packages, ceramic column grid array (CCGA) packages, and tape bonded ball grid array (TBGA) packages.

Ceramic column grid array (CCGA) packages are utilized in applications which require high power dissipation. For example, CCGA packages generally have a higher power dissipation capability than PBGA or CBGA packages. The CCGA package utilizes solder columns instead of solder spheres associated with CBGA and PBGA packages. The solder columns connect the package substrate to the printed circuit board.

The solder columns of the CBGA packages provide better thermal strain relief than solder balls. The solder columns can be 10 tin (Sn)/90 lead (Pb) materials measuring 0.5 millimeters (mm) in diameter and 1.27 mm or 2.2 mm in height. Other configurations for the solder columns are possible.

Generally, solder columns for CCGA packages can be fabricated in two configurations. First, CCGA solder columns can be implemented as wire columns which are eutectic soldered to both the bottom side of the substrate and to the printed circuit board site. Second, CCGA solder columns can be cast columns which are high-temperature soldered to the substrate and eutectic soldered to the printed circuit board. Other techniques are possible for attaching the solder columns to the substrate and printed circuit board.

Generally, as integrated circuits and integrated circuit packages become smaller and the functionality of integrated circuits and integrated circuit packages increases, the density of connections between the printed circuit board and the integrated circuit package has increased. For example, current microprocessors require a relatively high density of pins, columns or solder balls. Current microprocessors are often provided in a ceramic leadless grid array (CLGA) package similar to a PGA package except that pins are replaced with pads. However, the thermal stress between the CLGA package and the PC board can cause reliability problems. Accordingly, a CCGA interposer with columns can be added between the CLGA package and the PC board to reduce thermal stress, thereby greatly improving the reliability of the CLGA PC board connection.

In the process of attaching the columns associated with the CCGA interposer or CCGA package, neighboring columns can be unintentionally shorted due to solder overflow. Various conventional test equipment can be utilized to determine if columns are shorted. For example, an X-ray real-time microscope can determine short circuits or short failures associated with the columns. In addition, a multi-curve tracer (e.g., manufactured by Ultra Test International, San Jose, Calif. can also be applied to locate short-circuited columns or failed sites. However, both of these conventional techniques require expensive equipment and are time consuming.

According to another technique, a conventional joint action test group (JTAG) tester for CLGA packages can be utilized. However, conventional JTAG testers are extremely expensive.

Thus, there is a need for a convenient and effective method of and apparatus for determining whether conductors of an IC package or interposer are short circuited. Further still, there is a need for a fast process for determining whether columns of a CCGA package or interposer are short circuited. Even further still, there is a need for a simple system and process that can determine the integrity of neighboring conductors of an IC package.

SUMMARY OF THE INVENTION

An exemplary embodiment relates to a test system for testing conductors of an integrated circuit package. The test system is capable of determining an existence of one or more short circuits between adjacent conductors. The system includes an interface and a control circuit. The interface is configured to electrically connect to the conductors of the integrated circuit package. The interface groups the conductors into a plurality of nodes. The number of nodes are no more than one-half the number of conductors. The control circuit is coupled to the interface and determines the existence of one or more short circuits between adjacent conductors in response to signals on the nodes.

Another exemplary embodiment relates to a method of testing conductors of an integrated circuit package. The conductors are tested to determine an existence of one or more short circuits between adjacent conductors. The method includes electrically coupling the conductors to an interface. The interface electrically connects to the conductors of the integrated circuit package and groups the conductors into a plurality of nodes. The number of nodes are no more than one-half the number of conductors. The method also includes providing signals to the nodes and comparing the signals at the nodes to determine the existence of one or more short circuits between adjacent conductors.

Still another embodiment relates to a test system for a column grid array (CGA) package or CGA interposer. The test system includes an interface means and a control means. The interface means receives columns of the column grid array package and groups the columns into eight or less nodes. The control means senses an existence of a short circuit between adjacent columns in response to signals from the nodes.

BRIEF DESCRIPTION OF THE DRAWINGS

Exemplary embodiments will hereafter be described with reference to the accompanying drawings, wherein like numerals denote like elements and.

DETAILED DESCRIPTION OF THE PREFERRED EXEMPLARY EMBODIMENTS

Figure 1:
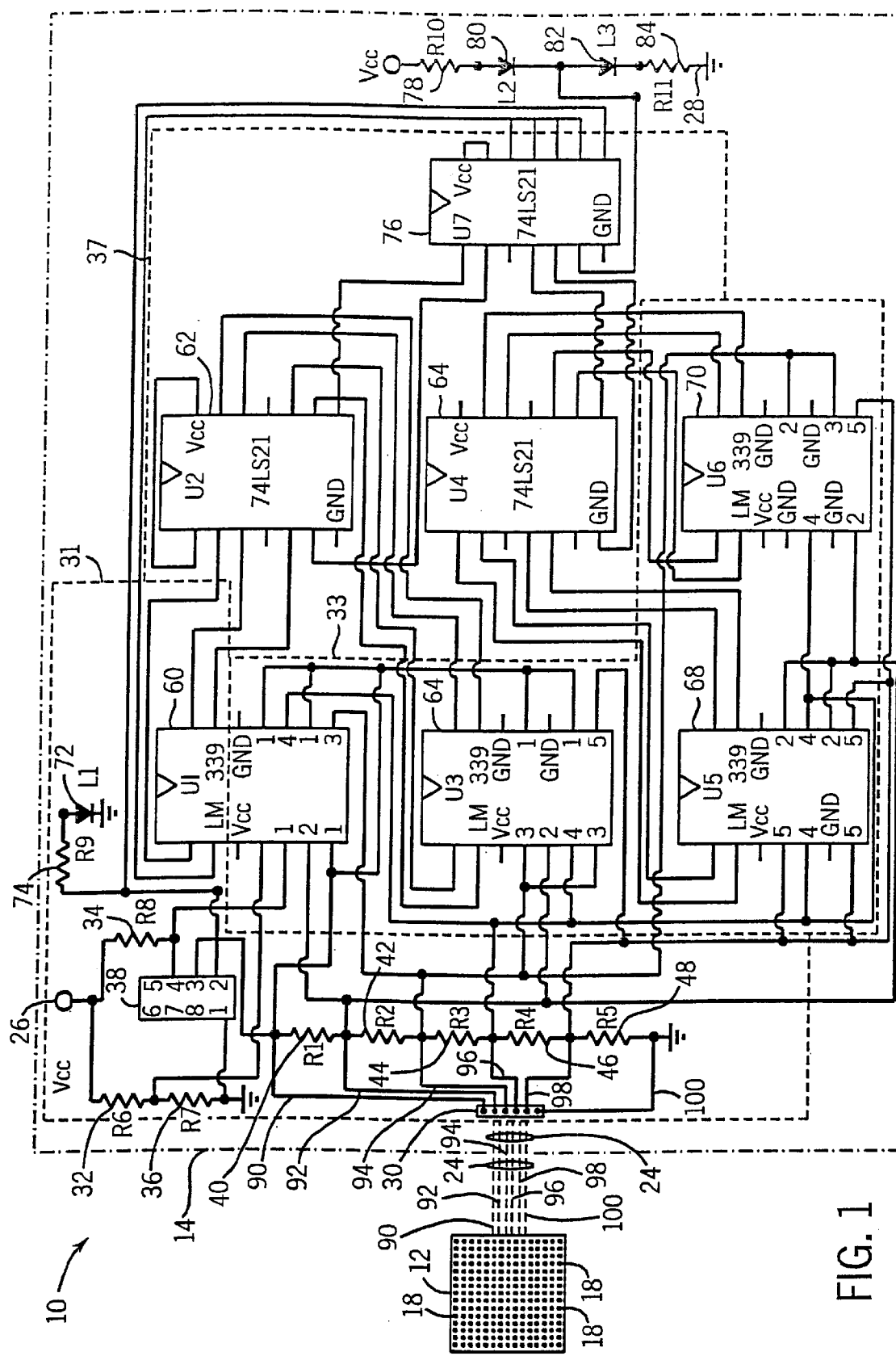
FIG. 1 is a general electrical schematic block diagram of a test system including an interface and a control circuit in accordance with an exemplary embodiment of the present invention.

With reference to FIG. 1, a test system 10 includes an interface 12 and a control circuit 14. Interface 12 is preferably an integrated circuit (IC) package socket configured to receive an integrated circuit package, such as, a column grid array (CGA) package or CGA interposer. Alternatively, interface 12 can be configured to connect with other types of IC packages. A number of exemplary CGA packages 50, such as those manufactured by IBM for ASIC devices, are shown in FIG. 3.

Figure 3:
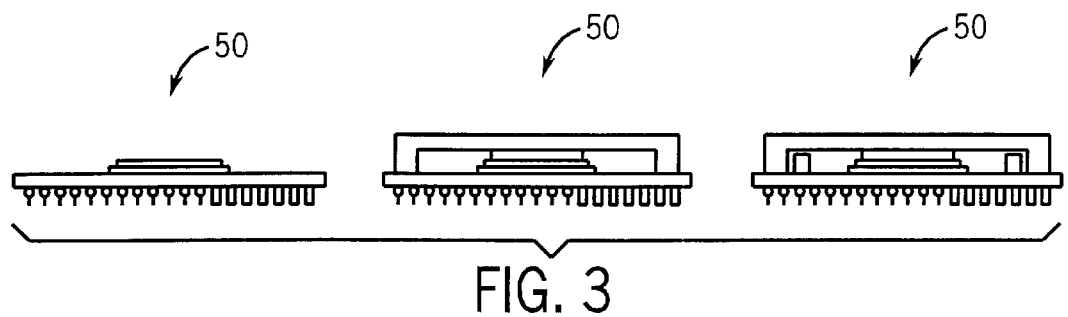
FIG. 3 includes three cross-sectional views of embodiments of ceramic column grid array packages.
Figure 4:
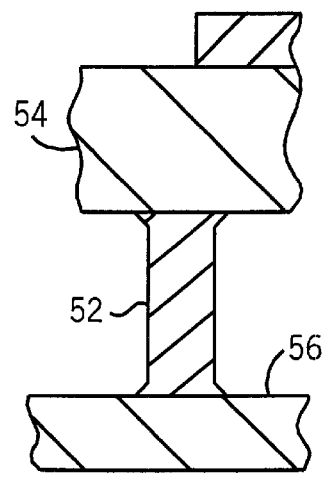
FIG. 4 is a partial cross-sectional view of a ceramic grid array package coupled to a printed circuit board.

Although CGA packages are shown in FIG. 3, system 10 can be utilized with a CLGA package and a CCGA interposer. For the purpose of this application, the term CCGA or CGA package includes any package utilizing a CCGA or CGA interposer. Packages 50 generally include a matrix of solder columns 52 (FIG. 4) for coupling a substrate 54 associated with the package to a printed circuit board 56.

Alternatively, system 10 can be utilized to test various types of integrated circuit packages including ball grid array (BGA), ceramic leadless grid array (CLGA), pin ball grid array (PGA), or other package. Preferably, interface 12 is configured to receive a CGA interposer coupled to a CLGA package containing a microprocessor.

Interface 12 can include sockets or holes 18 configured to receive conductors or solder columns 52 associated with packages 50. Interface 12 preferably includes a multi-layer printed circuit board including a number of printed circuit board layers 200, 202, 204 and 206 (FIG. 2) or other wiring for connecting package 50 to control circuit 14. Preferably, a six conductor bus 24 allows signals to be communicated between interface circuit 12 and control circuit 14. Bus 24 is coupled to connector 30 which is a six pin connector.

Interface 12 advantageously reduces the number of nodes that must be analyzed for short circuit conditions. In one embodiment, interface 12 joins the conductors (columns 52) associated with sockets 18 to form nodes numbering one half or less the number of sockets (as described below with references to FIG. 2). System parameters and design criteria can affect the number of nodes utilized by system 10. For example, some devices can have a large number of conductors shorted together on the integrated circuit, thereby reducing the number of nodes. Various reduction techniques and configurations can be utilized by interface 12 without departing from the scope of the invention.

Control circuit 14 includes a power node 26, a ground node 28, a connector 30, a bias circuit 31, a comparator array 33, and an AND logic circuit or device 37. Circuit 14 further includes a resistor 78, an indicator 80, an indicator 82 and a resistor 84.

Bias circuit 31 includes a resistor 32, a resistor 34, a resistor 36, a relay 38, a resistor 74, and an indicator 72. Bias circuit 31 also includes one comparator in comparator package 60 and a resistor ladder comprising a resistor 40, a resistor 42, a resistor 44, a resistor 46, and a resistor 48. Relay 38 performs the function of switching off the power supply to the device under test (DUT) if the voltage drop on the device exceeds the safe operating voltage preventing electrical damage to the DUT. Indicator 72 is preferably an orange LED that indicates that power is provided to circuit 31.

Comparator array 33 includes three-quarters (three comparators) of comparator package 60, a comparator package 64, a comparator package 68, and a comparator package 70. AND logic circuit 37 includes an AND logic device or package 62, an AND logic device or package 64, and an AND logic device or package 76. Preferably, the output of each comparator in packages 60, 64, 68 and 70 is coupled to a resistor of 100 kilohms which in turn is coupled to node 26. Packages 60, 64, 68, and 70 can be LM339 devices containing four comparators.

Control circuit 14 can quickly determines whether any neighboring columns of columns 52 associated with package 50 being tested through interface 12 is short circuited. Alternatively, control circuit 14 can be a software configured circuit. Control circuit 14 can be a software-configured computer, an ASIC, a microprocessor, or other appropriate test or analyzer circuit.

Package 50 is tested by placing it within interface 12 so that columns 52 make contact with interface 12. Interface 12 groups columns 52 into a number of nodes. For example, in the embodiment shown in FIG. 1, interface 12 groups columns 52 into six nodes; four nodes are non-power/non-ground nodes (e.g., nodes 90, 92, 94, and 96) while two nodes are power/ground nodes (e.g., nodes 98 and 100). One node is for a power node (e.g., node 98) and the remaining node is for a ground node (e.g., node 100).

Nodes 90, 92, 94, 96, 98, and 100 are electrically connected through connector 30 to bias circuit 31 of control circuit 14. More particularly, control circuit 14 provides a distinct bias signal to each of nodes 90, 92, 94, 96, 98 and 100 via resistors 40, 42, 44, 46, and 48. Nodes 90, 92, 94, 96, 98 and 100 are coupled to successively lower voltages. Node 100 is coupled to ground 28. Each of nodes 90, 92, 94, 96, 98, and 100 is compared to each other via comparator array 33. The results of the comparison are provided to logic circuit 37. If comparator array 33 indicates that any of nodes 90, 92, 94, 96, 98, and 100 are shorted (a node has the same voltage of another node), AND logic circuit 37 indicates a fault. Preferably, AND logic circuit 37 indicates a fault by illuminating indicator 80 which is a red LED. If a fault is not detected, indicator 82, which is a green LED, is illuminated by circuit 37.

Array 33 is configured so that the positive inputs of five comparators is coupled to node 90 and the negative inputs of those five comparators is coupled to one of nodes 92, 94, 96, 98 and 100. The comparators will indicate a short condition with node 90 if the biased voltage of node 90 is at the same or a lower voltage than any of nodes 92, 94, 96, 98, and 100. If package 50 does not include any columns 52 shorted to node 90, node 90 has a higher voltage than nodes 92, 94, 96, 98, and 100 as provided by bias circuit 31.

According to a similar configuration, four comparators in array 33 include a positive input coupled to node 92. The negative input of those four comparators is coupled to one of nodes 94, 96, 98, and 100. Similar to node 90, if node 92 is shorted to any of nodes 94, 96, 98, or 100, node 92 does not have a higher voltage bias than each of nodes 94, 96, 98, or 100.

Similar to nodes 90 and 92, three comparators in array 33 have a positive input coupled to a node 94 and a negative input coupled to one of nodes 96, 98, and 100. Similar to nodes 90, 92, and 94, two comparators in array 33 have a positive input coupled to node 96 and a negative input coupled to one of nodes 98 and 100. Similar to nodes 90, 92, 94 and 96, one of the comparators in array 33 has a positive input coupled to node 98 and a negative input coupled to node 100 (i.e., to the ground).

Thus, comparator array 33 is configured to compare the voltages associated with nodes 90, 92, 94, 96, 98, and 100 to each other and determine if a short circuit exists. The outputs of the comparators are provided to inputs of AND packages 62 and 64 of AND logic circuit 37. The outputs of AND packages of 62 and 64 are provided to AND package 76 which drives indicators 80 and 82. Packages 62, 64, and 76 can be 74LS21 AND logic gate devices.

AND logic devices 62, 66 and 76 cooperate to perform an AND logic function of all of the outputs from comparator array 33. Preferably, AND logic circuit 37 also receives an input from bias circuit 31 so that indicators 80 and 82 are only illuminated when bias circuit 31 is providing voltage to nodes 90, 92, 94, 96, 98, and 100. In addition, an output of the comparator (package 60) in bias circuit 31 is coupled to AND logic circuit 37. The signal from the comparator ensures that power supply to the DUT is below the safe operating voltage.

Figure 2:
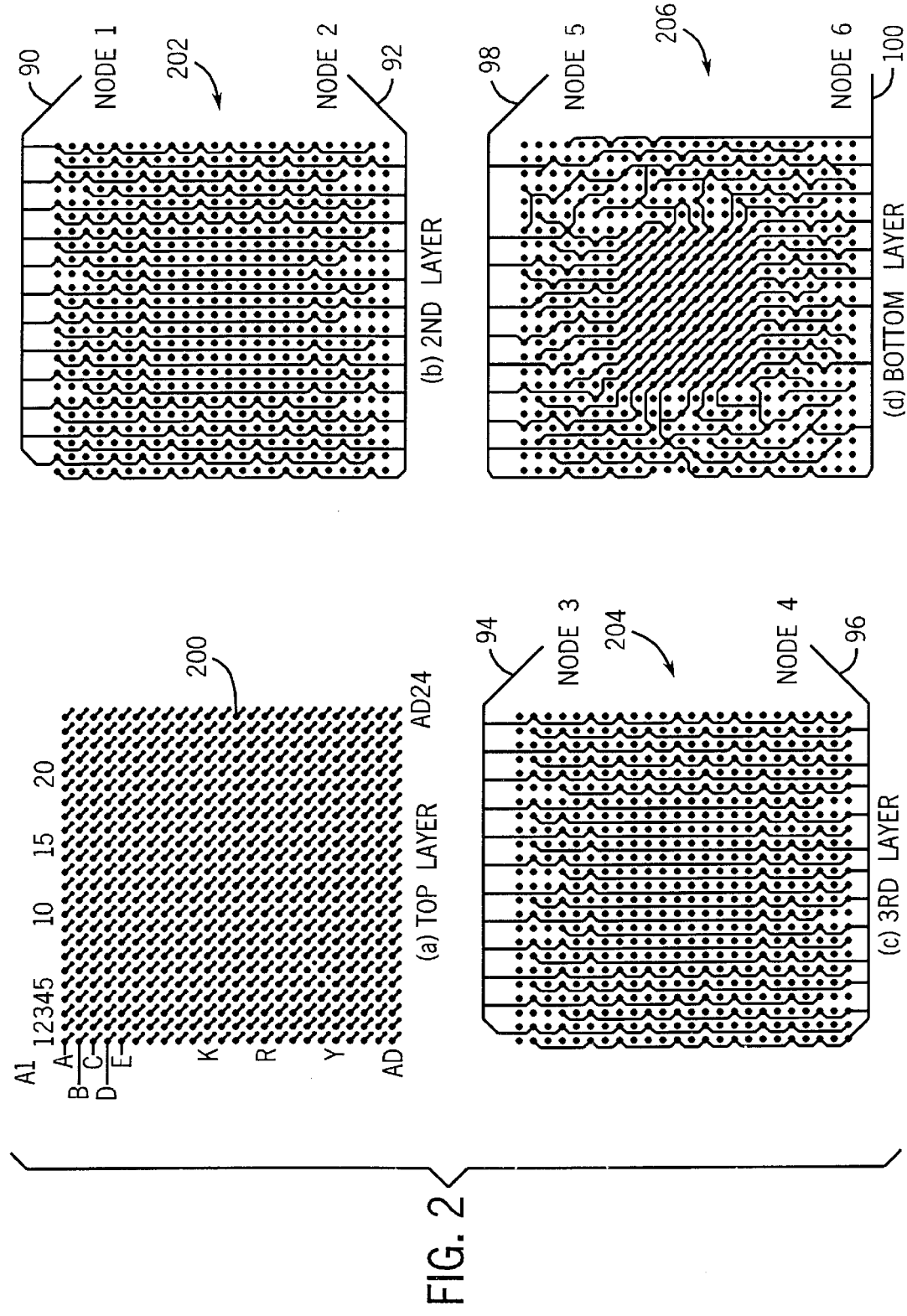
FIG. 2 is a layout drawing of four layers associated with the interface illustrated in FIG. 1.

With reference to FIG. 2, conductive layers 200, 202, 204 and 206 associated with interface 12 are shown. Layer 200 is preferably a top layer for contact between the multi-layer printed circuit board and sockets 18. Layer 202 is preferably the second layer and couples selected sockets 18 together to form a node 90 (node 1) and to form node 92 (node 2). Layer 204 is a third layer and couples selected sockets 18 together to form node 94 (node 3) and to form node 96 (node 4). Bottom layer 206 couples selected sockets together to form power node 98 and to form ground node 100.

The various interconnections illustrated in FIG. 2 are shown for example only. Preferably, the power and ground nodes for the device or package being tested are known and layers 200, 202, 204 and 206 are configured for the particular package. Advantageously, the interconnection shown in FIG. 2 reduces the number of connections required to determine short circuits associated with packages 50 from a large number of columns to six nodes. Nodes 90–96 are non-power and non-ground nodes while nodes 98 and 100 are power and ground nodes. In the example in FIG. 2, a 24×24 array of pins or columns 52 is reduced to 6 nodes.

Generally, interface 12 is configured to connect a large number of columns together without disrupting the ability to test for or sense short-circuited columns 52. Preferably, nodes 90–96 cooperate to connect the same position in each basic cell. The basic cell is a column with its eight neighboring columns (a square including nine columns). The same position in each basic cell is coupled together via nodes 92–96. In addition, the corner nodes can be shorted together as shown in layer 202 of FIG. 2 to further reduce the number of nodes from eight to four. An additional two nodes are required for power and ground nodes 98 and 100.

Preferably, socket 18 operates to reduce the number of nodes to less than at least half the number of pins or columns associated with package 50. The particular reduction shown in FIG. 2 and the means of reducing the 24×24 array to six nodes is shown as an example only. The specific interconnections associated with layers 200, 202, 204, and 206 are not shown in a limiting fashion.

Generally, there are $((n-1)/2)$ combinations for all nodes, where n is the total number of nodes. If there is not a short circuit between two nodes, the corresponding comparator provides a high logic output to AND logic circuit 37. If there is a short circuit between two nodes, the corresponding comparator provides a logically low level output to AND logic device 37. When all the outputs of the comparators in array 33 are a logically high level, AND logic circuit 37 provides a logically high level output indicating that package 50 does not contain any shorts.

Preferably, bias circuit 31 is configured so that the maximum current passing through package 50 is safe for testing package 50. Further, bias circuit 31 preferably supplies a safe level of voltage and current to nodes 90, 92, 94, 96, 98, and 100. Generally, voltages within the operating voltages of package 50 can be utilized.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims. For example, control circuit 14 and interface circuits 12 discussed with reference to the various figures are shown as particular examples only. A variety of circuitry can be utilized to implement the principles of the present invention.

What is claimed is:

1. A test system for testing conductors of an integrated circuit package to determine an existence of one or more short circuits between adjacent conductors, the conductors including power conductors and ground conductors, the system comprising:

an interface configured to electrically connect to the conductors of the integrated circuit package;

the interface grouping the conductors into a plurality of nodes, wherein the number of nodes are no more than one half the number of conductors, the nodes including a power node associated with the power conductors and a ground node associated with the ground conductors; and a control circuit coupled to the interface, the control circuit determining the existence of one or more short circuits between adjacent conductors in response to signals on the nodes.

2. The system of claim 1, wherein the control circuit includes a comparator and an LED.

3. The system of claim 1, wherein the control circuit is a microprocessor-based circuit.

4. The system of claim 2, wherein the control circuit includes an AND logic device coupled to an array of comparators.

5. The system of claim 4, wherein the AND logic device drives the LED.

6. The system of claim 1, wherein the interface is a socket including three layers.

7. The system of claim 6, wherein the interface provides two nodes on each layer.

8. The system of claim 1, wherein the nodes include a first node, wherein the conductors are arranged in columns, wherein the first node is coupled to every other non-power/non-ground conductor of the conductors in every other column of the columns.

9. The system of claim 1, wherein the conductors can be grouped into a matrix of unit cells and the conductors that are not power conductors and are in the same position are electrically coupled together.

10. A method of testing conductors of an integrated circuit package to determine an existence of one or more short circuits between adjacent conductors, the method comprising:

electrically coupling the conductors to an interface, the interface electrically coupling to the conductors of the integrated circuit package, the interface grouping the conductors into a plurality of nodes, wherein the number of nodes are no more than one half the number of conductors;

providing voltage signals to the nodes, each node receiving a distinct voltage level; and comparing the voltage signals at the nodes to determine the existence of one or more short circuits between adjacent conductors.

11. The method of claim 10, wherein the signals are DC bias signals.

12. The method of claim 10 further comprising:

immediately providing an indication of the existence of one or more short circuits between adjacent conductors.

13. The method of claim 12, wherein the indication is a lit LED.

14. The method of claim 10, wherein the comparing step utilizes voltage comparators and AND logic.

15. The method of claim 10, wherein the package is a column grid array package.

16. The method of claim 15, wherein the conductors are columns associated with a ceramic column grid array package, the conductors including power conductors and ground conductors being grouped into a power node and a ground node, respectively.

17. A test system for a column grid array package or interposer, the test system comprising:

interface means for receiving columns of the column grid array package, the interface means grouping the columns into eight or less nodes the nodes including a power node and a ground node; and control means for sensing an existence of a short circuit between adjacent columns in response to signals from the nodes.

18. The test system of claim 17, wherein the control means includes an array of comparators.

19. The test system of claim 17, wherein the interface means groups the columns into four non-power or non-ground nodes.

20. The test system of claim 19, wherein the control means provides a distinct voltage level to the four non-power or non-ground nodes, the power node receiving a power voltage level associated with the column grid array package and the ground node receives a ground voltage level associated with the column grid array package.

* * * * *